(12) United States Patent
Auger et al.

(10) Patent No.: US 10,675,665 B2
(45) Date of Patent: Jun. 9, 2020

(54) COATED EXTRUSION TOOL

(71) Applicant: IHI Ionbond AG, Olten (CH)

(72) Inventors: Michael Auger, Mels (CH); Hristo Strakov, Oftringen (CH); Vasileios Papageorgiou, Zofingen (CH); Stylianos Vogiatzis, Safenwil (CH); Val Lieberman, Kriens (CH)

(73) Assignee: IHI Ionbond AG., Dulliken (CH)

( * ) Notice: Subject to any disclaimer, the term of this patent is extended or adjusted under 35 U.S.C. 154(b) by 470 days.

(21) Appl. No.: 15/371,742

(22) Filed: Dec. 7, 2016

(65) Prior Publication Data

US 2017/0157829 A1 Jun. 8, 2017

Related U.S. Application Data

(60) Provisional application No. 62/263,964, filed on Dec. 7, 2015.

(51) Int. Cl.
*B29C 48/12* (2019.01)
*B21C 25/02* (2006.01)
(Continued)

(52) U.S. Cl.
CPC ............ *B21C 25/025* (2013.01); *B21C 25/02* (2013.01); *B29C 48/30* (2019.02);
(Continued)

(58) Field of Classification Search
CPC .............. B29C 48/3003; B29C 48/509; B29C 48/6803; B29C 33/56; B29C 33/60;
(Continued)

(56) References Cited

U.S. PATENT DOCUMENTS

| 6,117,280 A * | 9/2000 | Yaginuma ................. C23C 8/38 |
| | | 204/192.1 |
| 2005/0003239 A1* | 1/2005 | Derflinger ............. C23C 14/027 |
| | | 428/698 |

(Continued)

FOREIGN PATENT DOCUMENTS

| CN | 1954043 A | 4/2007 |
| CN | 104368833 A | 2/2015 |

(Continued)

OTHER PUBLICATIONS

Kawata et al. ("Characterization of Multilayer Films of Ti—Al—O—C—N System Prepared by Pulsed D.C. Plasma-Enhanced Chemical Vapor Deposition", Thin Solid Films 390 (2001), pp. 64-69, Jun. 30, 2001 (Year: 2001).*

(Continued)

*Primary Examiner* — Joseph S Del Sole
*Assistant Examiner* — Lawrence D. Hohenbrink, Jr.
(74) *Attorney, Agent, or Firm* — Dinsmore & Shohl LLP; Weston R. Gould

(57) ABSTRACT

Provided are extrusion tools such as extrusion dies or portions thereof having a surface with at least one coating thereon, and methods of forming the same are disclosed. The at least one coating is formed from a composition that is a metal aluminum nitride or carbonitride with particular characteristics such that the amount of aluminum varies within the coating between a coating outer surface and an intermediate thickness within the coating. The resulting coatings have tailored physical and performance characteristics that result in improved wear and extrusion performance.

10 Claims, 10 Drawing Sheets

(51) Int. Cl.
| | |
|---|---|
| *B29C 48/30* | (2019.01) |
| *C23C 16/34* | (2006.01) |
| *C23C 16/36* | (2006.01) |
| *B29C 48/68* | (2019.01) |
| *B29C 33/60* | (2006.01) |
| *B29C 48/505* | (2019.01) |
| *C23C 16/00* | (2006.01) |
| *B29C 33/56* | (2006.01) |

(52) U.S. Cl.
CPC .......... *B29C 48/3003* (2019.02); *C23C 16/34* (2013.01); *C23C 16/36* (2013.01); *B29C 33/56* (2013.01); *B29C 33/60* (2013.01); *B29C 48/509* (2019.02); *B29C 48/6803* (2019.02); *B29K 2905/12* (2013.01); *B29K 2909/04* (2013.01); *C23C 16/00* (2013.01); *C23C 16/347* (2013.01)

(58) Field of Classification Search
CPC ..... B29K 2905/12; C23C 16/00; C23C 16/34; C23C 16/36; C23C 16/347
USPC ........................................................ 264/461
See application file for complete search history.

(56) References Cited

U.S. PATENT DOCUMENTS

| | | | |
|---|---|---|---|
| 2008/0006964 | A1 | 1/2008 | Kanmura |
| 2011/0003126 | A1* | 1/2011 | Van Den Berg ........ C23C 16/24 428/216 |
| 2012/0090247 | A1* | 4/2012 | Miura ................. C23C 14/0036 51/309 |
| 2015/0050490 | A1* | 2/2015 | Kumar ............. H01J 37/32669 428/336 |

FOREIGN PATENT DOCUMENTS

| | | |
|---|---|---|
| CN | 105112884 A | 12/2015 |
| DE | 10061436 A1 | 6/2002 |

OTHER PUBLICATIONS

Kazuki Kawata et al, "Characterization of Multilayer Films of Ti—Al—O—C—N System Prepared by Pulsed d.c. Plasma-enhanced Chemical Vapor Deposition," Thin Solid Films 390 (2001) 64-69.

S. Paldey and S.C. Deevi, "Single Layer and Multilayer Wear Resistant Coatings of (Ti,Al):P a Review," Materials Science and Engineering A342 (2003), 58-79.

* cited by examiner

COATED EXTRUSION TOOL

CROSS-REFERENCE TO RELATED APPLICATION

The present application claims priority to U.S. Provisional Patent Application Ser. No. 62/263,964, filed Dec. 7, 2015, the entire content of which is incorporated herein by reference.

BACKGROUND

Field

The present specification generally relates to extrusion tools, and, more specifically, to extrusion tools having surface treatments thereon.

Technical Background

Extrusion tools, such as dies and/or other tools that are used to extrude metals, metal alloys, plastics, and the like, are subject to conditions that cause the extrusion tools to wear out after a particular number of uses or after a particular period time has elapsed. When this occurs, the extrusion tools must be discarded, replaced, and/or the like. Previous solutions to the unwanted rapid wear of such extrusion tools included applying a coating to encapsulate the extrusion tool (or a portion thereof) with a protective material. Illustrative protective materials used in the past included steel or cemented carbide.

Many extrusion tools are designed with one or more recessed surfaces, such as cavities or the like, which exhibit relatively high aspect ratios. For such tools, use of a physical vapor deposition (PVD) technique to deposit a protective coating may be difficult or impossible due to a "line-of-sight" limitation of the PVD technique that results in coating areas only within a "line-of-sight" of the PVD nozzle (or other application tool) and resulting in an extrusion tool that is not effectively fully coated, or at least not coated sufficiently in all desired areas. As such, various chemical vapor deposition (CVD) processes have been used to apply coatings. However, such CVD processes may not be able to provide a desired degree of improvement for the extrusion tools. Depending on the operating conditions, the type of the extruded material, and/or other factors, extension of the useful life of the tools may not be achieved and/or may not be justifiable due the cost of the CVD process.

Accordingly, a need exists for methods of coating extrusion tools that ensures every surface desired to be coated is actually coated, as well as materials that can be coated on the extrusion tools via CVD in a cost effective manner and that increase the operating life of the extrusion tools relative to one or more existing materials.

SUMMARY

The following summary is provided to facilitate an understanding of some of the innovative features unique to the present disclosure and is not intended to be a full description. A full appreciation of the various aspects of the disclosure can be gained by taking the entire specification, claims, drawings, and abstract as a whole.

Technical Problems

Increasing operating life of an extrusion tool such as an extrusion die is of paramount importance to improving the quality of extruded products as well as reducing the need for expensive replacement of the tool. It is therefore an object of the present invention to provide an extrusion tool with improved properties, as described by one or more of the following objects.

As such, it is an object to provide an extrusion tool that allows for superior tool life, increased performance, and/or lower costs. The extrusion tool may exhibit improved hardness, coefficient of friction, surface morphology and/or roughness, and thus have enhanced performance characteristics in the context of extrusion applications. It is an object of the present disclosure to provide a possibility of manipulating the coating properties in order to allow producing an extrusion tool with controlled and tuned performance.

Another object of the present disclosure is to provide a smooth, yet wear resistant surface and/or coated extrusion tool having long service life and high geometrical accuracy.

A yet another object of the present disclosure is to provide a method of forming an extrusion tool having the above-described advantages. Furthermore, it is another object to provide a method for coating extrusion tools that ensures that every surface desired to be coated is actually coated, as well as materials that can be coated on the extrusion tools via CVD in a cost effective manner and that increase the operating life of the extrusion tools relative to one or more existing materials.

Solution to the Problems

These objects are addressed by the provided tools and processes whereby the extrusion tool includes a guide channel intended to channel or otherwise shape or conduct a material to be extruded, the guide channel having a length and defined by a surface, whereby the surface includes a coating, optionally a CVD coating, disposed thereon that provides for improved tool performance. A coating as provided comprises at least one layer including $Me_{1-x}Al_xN$ and or $Me_{1-x}Al_xCN$ wherein Me is a metal, x is an atomic ratio aluminum relative to the total amount of Me and aluminum, and the coating having a thickness whereby the value of x varies through the thickness, and whereby the value of x at the outer surface of the coating is different from the value of x at an intermediate thickness. By altering the value of x in the coating throughout its thickness, increased tool performance is realized.

In some aspects, the coating includes a value of x at an intermediate thickness that is lower than the value of x at an outer surface of the coating. Optionally, x at the intermediate thickness is from 0.78 to 0.88 or any value or range therebetween. The value of x at the outer surface is higher than at the intermediate thickness. Optionally, x at the outer surface of the coating thickness is from 0.85 to 0.92. In some aspects a coating includes $Me_{1-x}Al_xN$ as a coating material. In some aspect, a coating includes $Me_{1-x}Al_xCN$ as a coating material. In some aspects a coating includes both $Me_{1-x}Al_xN$ and $Me_{1-x}Al_xCN$ as a coating material. The operative values of x are applicable to both a $Me_{1-x}Al_xN$ and $Me_{1-x}Al_xCN$ individually or in conjunction. A metal in a coating composition is optionally titanium, chromium, zirconium, hafnium, vanadium, or any combination thereof. In some aspects, a metal is titanium. Optionally, a coating includes both titanium and chromium in addition to aluminum.

The coatings as provided have a microhardness. The microhardness as measured by the Vickers method optionally varies through the thickness or a portion of the thickness of the coating. In some aspects, the coating outer surface has a lower microhardness than an intermediate thickness. It was found that providing a softer outer surface creates a conformal layer that improves tool performance and the quality of a resulting extruded product. Optionally, a relatively softer outer coating surface is supported by and optionally may wear to an intermediate thickness of harder coating material. Optionally, the outer surface of the coating has a microhardness of 2300 $HV_{0.025}$ to 2900 $HV_{0.025}$. An intermediate thickness, optionally adjacent to an outer surface thickness, optionally has a microhardness of 3000 $HV_{0.025}$ to 3600 $HV_{0.025}$.

Some aspects include a coating whereby the crystal form of the coating varies throughout the coating thickness. Optionally, more than one crystal form is present in the thickness whereby the relative amount of one crystal form varies through the thickness. Optionally, a thickness is characterized by a cubic crystal form, a hexagonal wurtzite crystal form, or both cubic and a hexagonal wurtzite crystal forms. Optionally, an intermediate thickness is or includes a cubic crystal form. Optionally, an outer surface is or includes a hexagonal wurtzite crystal form. Optionally, the relative amount of hexagonal wurtzite crystal from relative to cubic crystal form is greater at the coating outer surface than at an intermediate thickness.

As described above, it is another object to provide a method of forming a coating on an extrusion tool, optionally an extrusion tool as provided herein with one or more of the characteristics described above or otherwise herein. A method is based on chemical vapor deposition (CVD) processes. It was found that CVD can provide a coating on a non-uniform surface, optionally, the guide channel of an extrusion tool, optionally, the entire surface or substantially entire surface of an extrusion tool resulting in superior tool performance. The method includes providing an extrusion tool including one or more guide channels each defined by a surface. The surface is optionally contiguous with other guide channels or is substantially separated therefrom. The depositing causes a coating to form on the surface of the guide channel. Coatings with the characteristics as described herein are optionally achieved by the provided processes. Optionally, the step of depositing includes depositing the plurality of precursor materials. As will be understood, the precursor materials of the CVD coating are not deposited as such but typically undergo chemical reactions to form the material that is actually deposited. Optionally, the plurality of materials is selected from hydrogen, nitrogen, carbon, an aluminum halide compound, a metal halide compound, ammonia, and a hydrocarbon. Such a deposition can produce a coating that includes one or more layers $Me_{1-x}Al_xN$ and or $Me_{1-x}Al_xCN$ wherein Me is a metal, x is an atomic ratio aluminum relative to the total amount of Me and aluminum; and the coating will have a thickness whereby the value of x varies through the thickness, and whereby the value of x at the outer surface of the coating is different from the value of x at an intermediate thickness. In some aspects, depositing the plurality of precursor materials comprises depositing each one of the plurality of precursor materials simultaneously. Optionally, depositing the plurality of precursor materials is performed in an environment having a temperature of 650 degrees Celsius to 1050 degrees Celsius. Optionally, the depositing of precursor material is performed in an environment having a pressure of 1 mbar to 60 mbar. The step of depositing may be performed for a desired time to adjust the desired thickness of the resulting coating. Optionally, the plurality of precursor materials are deposited for at least 20 minutes. In some aspects, depositing the plurality of precursor materials includes depositing at least one of the plurality of precursor materials at a flow rate of 0.1 liters per minute (1/min) to 250 1/min. Optionally, depositing the plurality of precursor materials includes depositing at least one of the plurality of precursor materials at a flow rate of 50 grams per hour (g/h) to 100 g/h.

Additional features and advantages of the aspects described herein will be set forth in the detailed description which follows, and, in part, will be readily apparent to those skilled in the art from that description or recognized by practicing the aspects described herein, including the detailed description which follows, the claims, as well as the appended drawings.

It is to be understood that both the foregoing general description and the following detailed description describe various aspects and are intended to provide an overview or framework for understanding the nature and character of the claimed subject matter. The accompanying drawings are included to provide a further understanding of the various aspects, and are incorporated into and constitute a part of this specification. The drawings illustrate various aspects described herein, and together with the description serve to explain the principles and operations of the claimed subject matter.

Specifically, as a particular solution to the above-formulated objects, the present disclosure provides an extrusion tool and the method defined in the appended claims.

Advantageous Effects

It should now be understood that the extrusion tools described herein are coated with one or more metal aluminum nitride and/or metal aluminum carbonitride coatings. Such coatings on the extrusion tools result in coated extrusion tools that exhibit increased performance and a longer service life relative to other extrusion tools. The coated extrusion tools further can exhibit lower roughness properties and/or higher geometrical accuracy relative to other extrusion tools.

The method according to the present invention provides a possibility for producing coated extrusion tools with decreased coating roughness, increased operating life, higher geometrical accuracy and/or with a reduced amount of manufacturing steps and costs required. Furthermore, the present inventors found that modifying the composition of the coating, more specifically the aluminum content therein, makes it possible to vary the base crystalline structure from hexagonal to cubic, thus influencing such properties of the coating as hardness, coefficient of friction, surface morphology and roughness, which determine performance characteristics of said extrusion tool. The ability to manipulate the coating properties allows to produce said extrusion tool with controlled and tuned performance.

BRIEF DESCRIPTION OF THE DRAWINGS

The aspects set forth in the drawings are illustrative and exemplary in nature and not intended to limit the subject matter defined by the claims. The drawings are not necessarily to scale. The following detailed description of the illustrative aspects can be understood when read in conjunction with the following drawings, where like structure is indicated with like reference numerals and in which:

DETAILED DESCRIPTION

Figure 1A:
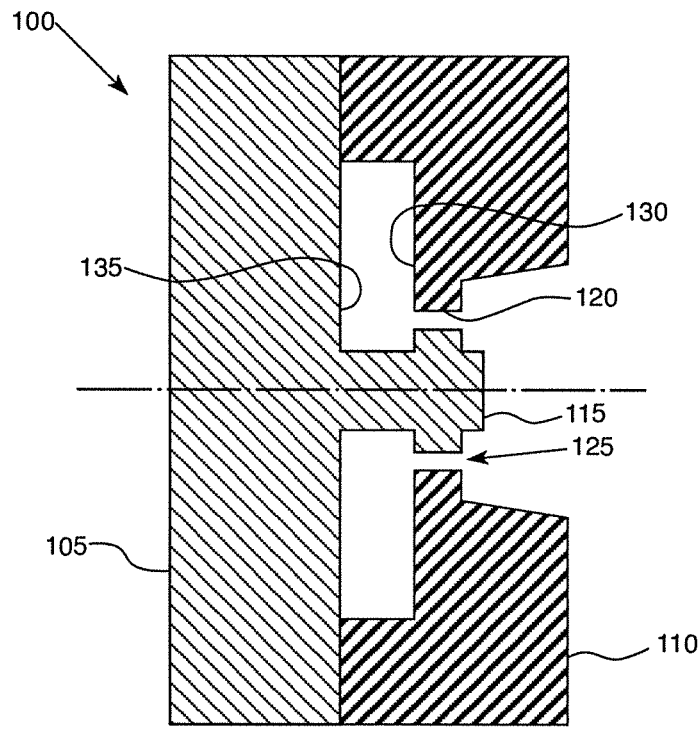
FIG. 1A schematically depicts a longitudinal sectional view of an illustrative extrusion tool provided with a coating according to one or more aspects shown and described herein.

The following description of particular aspect(s) is merely exemplary in nature and is in no way intended to limit the scope of the invention, its application, or uses, which may, of course, vary. The invention is described with relation to the non-limiting definitions and terminology included herein. These definitions and terminology are not designed to function as a limitation on the scope or practice of the invention but are presented for illustrative and descriptive purposes only. While the processes or compositions are described as an order of individual steps or using specific materials, it is appreciated that steps or materials may be interchangeable such that the description of the invention may include multiple parts or steps arranged in many ways as is readily appreciated by one of skill in the art.

It will be understood that, although the terms "first," "second," "third," etc. may be used herein to describe various elements, components, regions, layers, and/or sections, these elements, components, regions, layers, and/or sections should not be limited by these terms. These terms are used only to distinguish one element, component, region, layer, or section from another element, component, region, layer, or section. Thus, "a first element," "component," "region," "layer," or "section" discussed below could be termed a second (or other) element, component, region, layer, or section without departing from the teachings herein.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

Unless otherwise defined, all terms (including technical and scientific terms) used herein have the same meaning as commonly understood by one of ordinary skill in the art to which this disclosure belongs. It will be further understood that terms such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein the term "intermediate thickness" refers to any point along the thickness of the coating in between the outer surface of the coating and the opposite surface of the coating which is the surface facing the surface on which the coating is deposited.

The present disclosure relates generally to the surface treatment and production of extrusion tools, predominately for use in the extrusion of metals, metal alloys, ceramics, plastics, and/or the like. More specifically, the present disclosure relates to extrusion tools coated, optionally via chemical vapor deposition (CVD), with a metal aluminum nitride including the formula $Me_{1-x}Al_xN$ and/or metal aluminum carbonitride with a formula $Me_{1-x}Al_xCN$, where Me is a metal and x is an atomic ratio aluminum relative to the total amount of Me and aluminum. The compositions of the coating layer(s) may be adjusted so as to provide unique and tailored characteristics to the coating at different thicknesses. It was found that by providing a relatively softer outer surface to the coating that improved extrusion tool performance could be achieved. As such, coatings are provided with tailored characteristics that vary through the coating thickness, where such characteristics may be of composition, crystal structure, hardness, roughness, or combinations thereof. The coating optionally essentially consists of said metal aluminum nitride including the formula $Me_{1-x}Al_xN$ and/or metal aluminum carbonitride with a formula $Me_{1-x}Al_xCN$. Optionally, the coating materials are formed of metal and aluminum with nitrogen and/or carbon atoms may be embedded in the metal aluminum crystal lattice, such that a structurally unique coating material is provided that is distinguishable from aluminum doped metal based coatings. Particular coatings of the metal aluminum nitride and/or metal aluminum carbonitride will be described in various aspects herein. These coatings may serve in part or total, or as an underlayer adjacent to, optionally directly adjacent to an outer coating surface layer that is distinguishable on at least one coating characteristic. As a result of coating an extrusion tool, or other desired body, with the materials described herein, the extrusion tool may exhibit increased performance and a longer life span relative to extrusion tools that are uncoated, coated with other materials, or coated with similar materials but present in a different structure. For example, the extrusion tool coated with the materials described herein may exhibit lower roughness properties relative to extrusion tools that are uncoated or coated with other materials. In another example, the extrusion tool coated with the material described herein may exhibit a softer, less wear resistant surface in combination with an underlayer of a hard, wear resistant coating relative to extrusion tools that are uncoated or coated with other materials. As a result, the extrusion tool coated with the materials described herein may generally have a long service life and exhibit high geometrical accuracy.

In one aspect, the present disclosure is concerned with the CVD coated extrusion tool, in which the CVD technique is employed to produce a novel coating, comprised of metal aluminum nitride and/or metal aluminum carbonitride with formula $Me_{1-x}Al_xN$ or $Me_{1-x}Al_xCN$ with varying Me/Al ratios. The Me in said coating could be Ti, Cr, Zr, V and others, preferably Ti and Cr, most preferably Ti. The carbon content in the coating can vary between 0 and 8%, relative to the total amount of atoms in the coating. The coating can be deposited as a single layer or a combination of layers, thus forming a multilayered structure. The thickness of the coating could be in the range of from 1 to 49 µm, optionally from 1 to 20 µm, optionally from 1 to 10 µm. The coating materials are formed on the base of Me—Al solid solution (optionally Ti—Al) with nitrogen and optionally carbon atoms embedded in the elemental Me—Al lattice, thus making it different from aluminum-doped metal-based coatings. The CVD coating technique allows variation of Me and Al coating contents, optionally from x=0.6 to 0.9. The resulting compositional change makes it possible to vary the base crystalline structure from hexagonal to cubic, thus influencing such properties of the coating as hardness, coefficient of friction, surface morphology and roughness, which determine performance characteristics of said extrusion tool. The ability to manipulate the coating properties allows production of an extrusion tool with controlled and tuned performance. In particular, this the disclosure provides but is not limited to the following Aspects:

<1> An extrusion tool having a hard coating of the formula: $Me_{1-x}Al_xCN$ deposited thereupon; wherein Me is a metal, x is in the range of 0.6 to 0.9.

<2> The extrusion tool of Aspect <1> where the carbon content is between 0 and 8%.

<3> The extrusion tool of Aspect <1> wherein Me is selected from the group consisting of: Ti, Cr, Zr, V, and combinations thereof.

<4> The extrusion tool of Aspect <1>, wherein said hard coating has a thickness in the range of 1 to 49 µm.

<5> The extrusion tool of any one of the foregoing Aspects, wherein said hard coating comprises a single layer.

<6> The extrusion tool of any one of the foregoing Aspects, wherein said hard coating comprises a plurality of layers.

<7> The extrusion tool of any one of the foregoing Aspects, wherein said hard coating is of a uniform composition.

<8> The extrusion tool of any one of Aspect <1> to <5>, wherein the composition of said hard coating varies as a function of its thickness.

<9> The extrusion tool of any one of the foregoing Aspects, further including a second body of material disposed atop said hard coating.

<10> The extrusion tool of Aspect <8>, wherein said second body of material has a hardness which is less than the hardness of said hard coating.

<11> A method of making the extrusion tool of any one of Aspects <1> to <8>, comprising depositing said hard coating upon said extrusion tool by thin film deposition process.

<12> The method of Aspect 11, wherein said thin film deposition process is Chemical Vapor Deposition (CVD).

Referring now to the figures, FIG. 1 depicts a longitudinal sectional view of an illustrative extrusion tool, generally designated 100, according to some aspects. The extrusion tool 100 is not limited by this disclosure, and may be any device or component thereof that is generally recognized as being used for the purposes of shaping various materials via extrusion. In a non-limiting example, the extrusion tool 100 may be a die, a die component, a particular surface of a die, and/or the like. Although a two part extrusion die is depicted, the disclosure is equally applicable to single part extrusion dies or other multiple part extrusion dies.

The extrusion tool 100 may include, for example, a guide channel defined by one or more surfaces that form an interior portion of the extrusion tool. A guide channel has a length optionally between two substantially opposing sides whereby the configuration of the guide channel creates a tool capable of conducting an extrusion material to be extruded in the shape of the guide channel. In the exemplary aspect illustrated in FIG. 1A, a mandrel portion 105 is provided that forms a mandrel 115. The extrusion tool 100 may also include, for example, a die bolster 110 that cooperates with the mandrel portion 105. The mandrel portion 105 may form a plurality of inlets around a circumference of the mandrel 115 that include one or more guide channels 125 on the mandrel portion 105 between the mandrel 115 and a cylindrical wall 120 of the die bolster 110. In addition, a plurality of interior extrusion surfaces that result in an overall guide channel may be formed by the mandrel portion 105 and/or the die bolster 110, such as, for example, an inner wall 130 of the die bolster 110 and/or an inner wall 135 of the mandrel portion 105 (which may also be an inner wall of the mandrel 115). As such, a ductile material (e.g., a molten material, a liquid material, a semi-liquid material, or the like) may be guided through the guide channel 125. Optionally, the surface defined by the guide channel is a cavity in an interior portion of the extrusion tool, wherein, optionally, at least part of the recessed surface out of "line-of-sight," and/or the surface is defined by an aspect ratio greater than or equal to 2, wherein the aspect ratio corresponds to a ratio between depth of the cavity and its smallest cross-sectional dimension.

As will be described in greater detail herein, the extrusion tool 100 may be provided with a coating on one or more surfaces thereof. In some aspects, the extrusion tool 100 may be provided with a coating on all surfaces, regardless of whether a particular one of the surfaces contacts a ductile material to be extruded. In some aspects, the extrusion tool 100 may be provided with a coating on only surfaces that may come in contact with a ductile material to be extruded, such as, for example, surfaces that define the guide channel 125 (e.g., the mandrel 115 and/or the cylindrical wall 120 of the die bolster 110), one or more inner surfaces (e.g., the inner wall 130 of the die bolster 110 and/or the inner wall 135 of the mandrel portion 105), and/or the like.

In various aspects, the mandrel portion 105 and/or the die bolster 110 may be constructed of a high temperature steel with a corresponding long-term heat resistance and retention of hardness, such as, for example, hot work steel or other types of steel that are generally understood. For example, a steel composition having a chromium (Cr), molybdenum (Mo), and/or vanadium (V) alloy or the like may be used. Specific examples may include steel types 2344, 2367, and/or the like. However, it should be understood that such compositions are merely illustrative, and the mandrel portion 105 and/or the die bolster 110 may be constructed of other materials (including other steel compositions or non-steel materials) without departing from the scope of the present application.

Figure 1B:
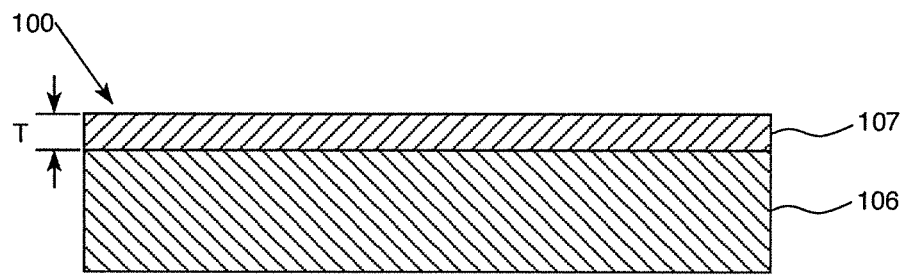
FIG. 1B schematically depicts a cross-sectional view of an illustrative layer produced on a surface of an extrusion tool according to one or more aspects shown and described herein.
Figure 1C:
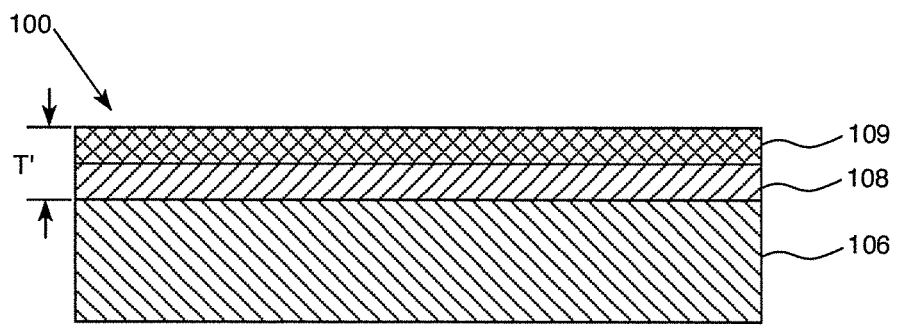
FIG. 1C schematically depicts a cross-sectional view of a plurality of illustrative layers produced on a surface of an extrusion tool according to one or more aspects shown and described herein.

FIGS. 1B and 1C depict illustrative coatings that may be provided on one or more of the surfaces of extrusion tool 100 according to various aspects. For example, as shown in FIG. 1B, the extrusion tool 100 may have a surface 106, optionally formed by the surface of the guide channel in part or in whole, that is coated with a coating 107. In another example, as shown in FIG. 1C, the surface 106 of the extrusion tool 100 may be coated with a first coating 108 and a second coating 109. It should be understood that the number of coatings provided on the surface 106 of the extrusion tool 100 is not limited by this disclosure, and that a particular surface may have no coatings or greater than two coatings. Furthermore, while FIG. 1C depicts the first coating 108 as contacting the surface 106 and the second coating 109 contacting the first coating 108 (but not the surface 106), the present disclosure is not limited to such. For example, the first coating 108 and the second coating 109 may be mixed together into a single layer that is disposed on the surface 106. In another example, the first coating 108 and the second coating 109 may be dispersed on the surface 106 such that portions of the surface 106 are in contact with the first coating 108 and other portions of the surface 106 are in contact with the second coating 109.

With reference to FIG. 1C, when providing the extrusion tool with the coating according to the present disclosure, the surface 106 of said extrusion tool 100 could be produced with a softer, less wear-resistant top layer (second coating 109) in combination with an underlayer of a hard, wear-resistant first coating 108. For example, such top layers could be or could include hexagonal phases of the coating mentioned herein ($Me_{1-x}Al_xCN$) or coatings like BN, $MoS_2$, $WS_2$ or other similar self-lubrication coatings. Optionally, such top layer includes a component selected from the group consisting of: a component having the formula $Me_{1-x}Al_xN$ and/or $Me_{1-x}Al_xCN$ as described above which includes as least in part a hexagonal wurtzite metal aluminum nitride and/or carbonitride; BN; $MoS_2$; $WS_2$; a self-lubrication coating; and any combination thereof. Such top layer optionally consists essentially of, and optionally consists of a component selected from said group.

This approach results in the extrusion tool, where the upper layer is quickly and controllably worn to produce a conformal surface providing low coefficient of friction. Both hard and soft components of the coating are based on the above mentioned metal carbonitrides. The resulting smooth yet wear-resistant coated extrusion tool produces an extrusion tool of long service life and high geometrical accuracy. The above example is not intended to limit the applicability of the invention to the described processing, but to illustrate one of the possible benefits achievable on the extrusion tools.

It is further appreciated that in some aspects an extrusion tool is coated on the entirety of the tool surface, substantially the entirety of the tool surface, or desired portions of the tool surface (e.g., the guide channel). For example, an extrusion tool is optionally coated on greater than 90% or greater of the tool surface, optionally 99% of the tool surface or greater. In some aspects, the entirety of the guide channel contacts a coating.

Referring now to FIG. 1B, the coating 107 may have a thickness T. The thickness T generally refers to a dimensional aspect of the coating 107 that extends from a portion of the coating 107 that contacts the surface 106 to an outermost portion of the coating 107. As used herein, the thickness is determined by means of a ball crater (calotest) on a coupon whereby the coating thickness can be calculated based on the resulting crater image measurements. In some aspects, the thickness T may be a particular thickness that results in a coated extrusion tool 100 having particular hardness and wear resistance properties, as described in greater detail herein. The thickness T is generally not limited by this disclosure, and may be any thickness, particularly a thickness that may be recognized as providing the various properties of the coating 107 as described herein. In some aspects, the thickness T may range from about 1 micrometers ($\mu m$) to about 100 $\mu m$, including about 1 $\mu m$, about 5 $\mu m$, about 10 $\mu m$, about 20 $\mu m$, about 30 $\mu m$, about 40 $\mu m$, about 50 $\mu m$, about 60 $\mu m$, about 70 $\mu m$, about 80 $\mu m$, about 90 $\mu m$, about 100 $\mu m$, or any value or range between any two of these values (including endpoints). In a particular aspect, the thickness T may range from about 1 $\mu m$ to about 49 $\mu m$. In another particular aspect, the thickness T may range from about 1 $\mu m$ to about 20 $\mu m$. In another particular aspect, the thickness T may range from about 1 $\mu m$ to about 10 $\mu m$. Optionally, the thickness T may range from 2 $\mu m$ to 100 $\mu m$; optionally from 2 $\mu m$ to 49 $\mu m$, optionally from 2 $\mu m$ to 40 $\mu m$, or optionally from 12 to 49 $\mu m$; optionally 1 $\mu m$ to 4.5 $\mu m$, optionally from 7.5 to 10.5 $\mu m$, optionally from 2 $\mu m$ to 4.5 $\mu m$, optionally from 7.5 to 9.5 $\mu m$.

A coating is optionally of a uniform thickness or substantially uniform thickness over the entirety of the tool surface, substantially the entirety of the tool surface or a desired region of the tool surface such as the surface of a guide channel. Optionally, a thickness varies by 50% or less over the tool surface or guide channel portion thereof. Optionally the thickness varies by 40% or less, 30% or less, 20% or less, 10%, or less, 5% or less, or 1% or less. As such, in some aspects the thickness of the coating is substantially uniform over the tool outer surface, tool inner surfaces, or combinations thereof.

Referring now to FIG. 1C, the first coating 108 and the second coating 109 may have a combined thickness T'. The thickness T' generally refers to a dimensional aspect of a combination of the first coating 108 and the second coating 109 that extends from a portion of the first coating 108 that contacts the surface 106 to an outermost portion of the second coating 109. In some aspects, the combined thickness T' may be a particular thickness that results in a coated extrusion tool 100 having particular hardness and wear resistance properties, as described in greater detail herein. The combined thickness T' is generally not limited by this disclosure, and may be any thickness, particularly a thickness that may be recognized as providing the various properties of the first coating 108 and the second coating 109 as described herein. In some aspects, the combined thickness T' may be greater than the thickness T of the coating 107 described with respect to FIG. 1B. In other aspects, the combined thickness T' may be substantially equivalent to the thickness T of the coating 107 described with respect to FIG. 1B. As such, each of the first coating 108 and the second coating 109, individually, may not be as thick as the coating 107 described with respect to FIG. 1B. In some aspects, the combined thickness T' may range from about 1 µm to about 100 µm, including about 1 µm, about 5 µm, about 10 µm, about 20 µm, about 30 µm, about 40 µm, about 50 µm, about 60 µm, about 70 µm, about 80 µm, about 90 µm, about 100 µm, or any value or range between any two of these values (including endpoints). It should be understood that in aspects where the surface 106 includes more than two layers, a combined thickness of the more than two layers may also be about 1 µm to about 200 µm, including about 2 µm, about 5 µm, about 10 µm, about 20 µm, about 30 µm, about 40 µm, about 50 µm, about 60 µm, about 70 µm, about 80 µm, about 90 µm, about 100 µm, or any value or range between any two of these values (including endpoints).

Referring again to FIGS. 1B and 1C, the coating 107 (or alternatively, the first coating 108 and the second coating 109) may exhibit a hardness. In some aspects, the hardness of the coating 107 (or the first coating 108 and the second coating 109) may be a particular hardness that results in the coated extrusion tool 100 having particular properties as described herein. Optionally, material of the coating 109 has a hardness which is less than the hardness of the material of the coating 108. As used herein, the hardness is defined as the Vickers microhardness $HV_{0.025}$. In some aspects, the coating 107 (or the first coating 108 and the second coating 109) may have a microhardness ranging from about 1900 $HV_{0.025}$ (measured by the Vickers method using a HV0.025 reference block, according to EN ISO 6507-1:2006) to about 3900 $HV_{0.025}$, including about 1900 $HV_{0.025}$, about 2000 $HV_{0.025}$, about 2100 $HV_{0.025}$, about 2200 $HV_{0.025}$, about 2300 $HV_{0.025}$, about 2400 $HV_{0.025}$, about 2500 $HV_{0.025}$, about 2600 $HV_{0.025}$, about 2700 $HV_{0.025}$, about 2800 $HV_{0.025}$, about 2900 $HV_{0.025}$, about 3000 $HV_{0.025}$, about 3100 $HV_{0.025}$, about 3200 $HV_{0.025}$, about 3300 $HV_{0.025}$, about 3400 $HV_{0.025}$, about 3500 $HV_{0.025}$, about 3600 $HV_{0.025}$, about 3700 $HV_{0.025}$, about 3800 $HV_{0.025}$, about 3900 $HV_{0.025}$, or any value or range between any two of these values (including endpoints). In a particular aspect, the coating 107 (or the first coating 108 and the second coating 109) may have a microhardness of about 2600±300 $HV_{0.025}$ to about 3300±300 $HV_{0.025}$. Optionally, a coating proximal to the tool surface, optionally directly adjacent to the tool surface or on top of an intermediate coating, has a microhardness of about 3300±300 $HV_{0.025}$. Optionally, a coating layer on the outer surface of the coating has a microhardness of about 2600±300 $HV_{0.025}$. Optionally, a coating proximal to the tool surface, optionally directly adjacent to the tool surface or on top of an intermediate coating, has a microhardness of about 3300±300 $HV_{0.025}$ and a coating layer on the outer surface of the coating has a microhardness of about 2600±300 $HV_{0.025}$.

The coating 107 (or alternatively, the first coating 108 and the second coating 109) may exhibit a particular roughness. The roughness of the coating 107 (or the first coating 108 and the second coating 109) may be understood to be an irregularity in the coating 107 (or the first coating 108 and the second coating 109) that is measured vertically from an outer edge of the coating 107 (or an outer edge of the second coating 109). As used herein, the roughness is defined as the average surface roughness measured over a length of 5.6 mm, also referred to as Ra, and is determined according to ISO 4287:2010. In some aspects, the roughness of the coating 107 (or the first coating 108 and the second coating 109) may range from about 0.02 µm to about 0.8 µm, including about 0.02 µm, about 0.03 µm, about 0.04 µm, about 0.05 µm, about 0.06 µm, about 0.07 µm, about 0.08 µm, about 0.09 µm, about 0.1 µm, about 0.2 µm, about 0.3 µm, about 0.4 µm, about 0.5 µm, about 0.6 µm, about 0.7 µm, about 0.8 µm, or any value or range between any two of these values (including endpoints).

Any one of the coatings 107, 108, 109 may include a metal aluminum carbonitride composition having the formula $Me_{1-x}Al_xCN$ and/or a metal aluminum nitride composition having the formula $Me_{1-x}Al_xN$, where Me represents a metal, Al represents aluminum, C represents carbon, and N represents nitrogen. The variable x ranges from zero (0) to one (1) and stands for the atomic ratio of the aluminum relative to the Me plus aluminum content total, whereby the atomic percent aluminum may range from about 0.60 to about 0.92, including about 0.60, about 0.65, about 0.70, about 0.75, about 0.76, about 0.77, about 0.78, about 0.79, about 0.80, about 0.81, about 0.82, about 0.83, about 0.84, about 0.85, about 0.86, about 0.87, about 0.88, about 0.89, about 0.90, about 0.91, about 0.92, or any value or range between any two of these values (including endpoints). Optionally, x is from about 0.78 to about 0.88. Optionally, x is about 0.85 to 0.92. Optionally, at an intermediate thickness, or coating layer, below the coating surface thickness or layer, x is from about 0.78 to about 0.88. Optionally, a coating surface has an x value of 0.85 to 0.92. Optionally, at an intermediate thickness, or coating layer, below the coating surface thickness or layer, x is from about 0.78 to about 0.88, and a coating surface has an x value of 0.85 to 0.92.

In various aspects, the coating material or a layer of coating material by include a metal aluminum carbonitride of the formula $Me_{1-x}Al_xC_yN_{1-y}$, where y is the ratio of carbon to the total of carbon to nitrogen. Illustrative values for y are optionally from 0 to 0.08. In some aspects, y is about 0 to about 0.08, including about 0, about 0.01, about 0.02, about 0.03, about 0.04, about 0.05, about 0.06, about 0.07, about 0.08, or any value or range between any two of these values (including endpoints). There are several different methods which can be used for the determination of the carbon content. As used herein, the carbon content can be determined by Energy Dispersive X-ray Spectroscopy (EDX or EDS).

The metal portion of the metal aluminum carbonitride composition and/or the metal aluminum nitride composition is not limited by this disclosure, and can be any metal. In some aspects, the metal may be titanium (Ti), chromium (Cr), zirconium (Zr), hafnium (Hf), vanadium (V), or the like. As will be described in greater detail herein, the metal may be provided in a solid solution phase between its binary counterparts, e.g., aluminum nitride (AlN) and metal nitride (MeN).

Figure 2A:
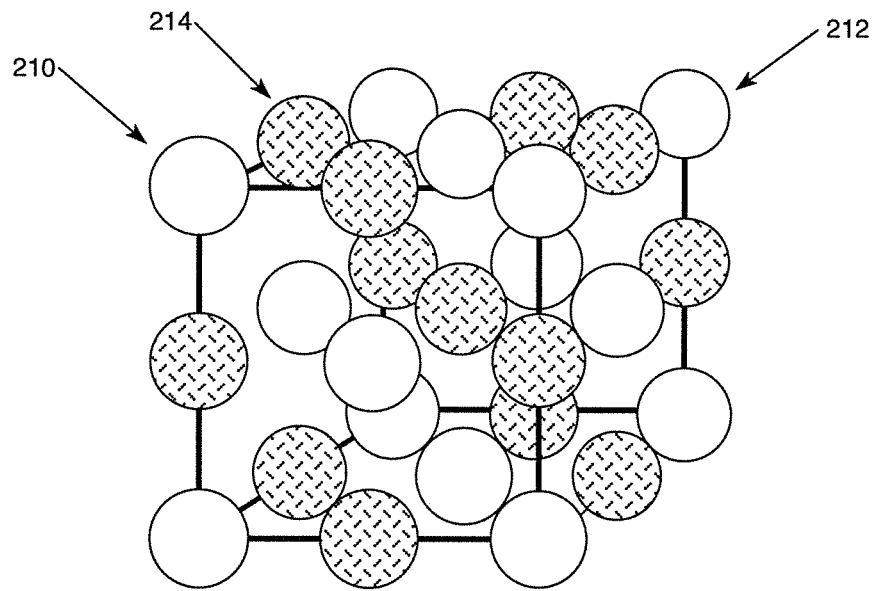
FIG. 2A depicts an illustrative cubic crystal structure according to one or more aspects shown and described herein.
Figure 2B:
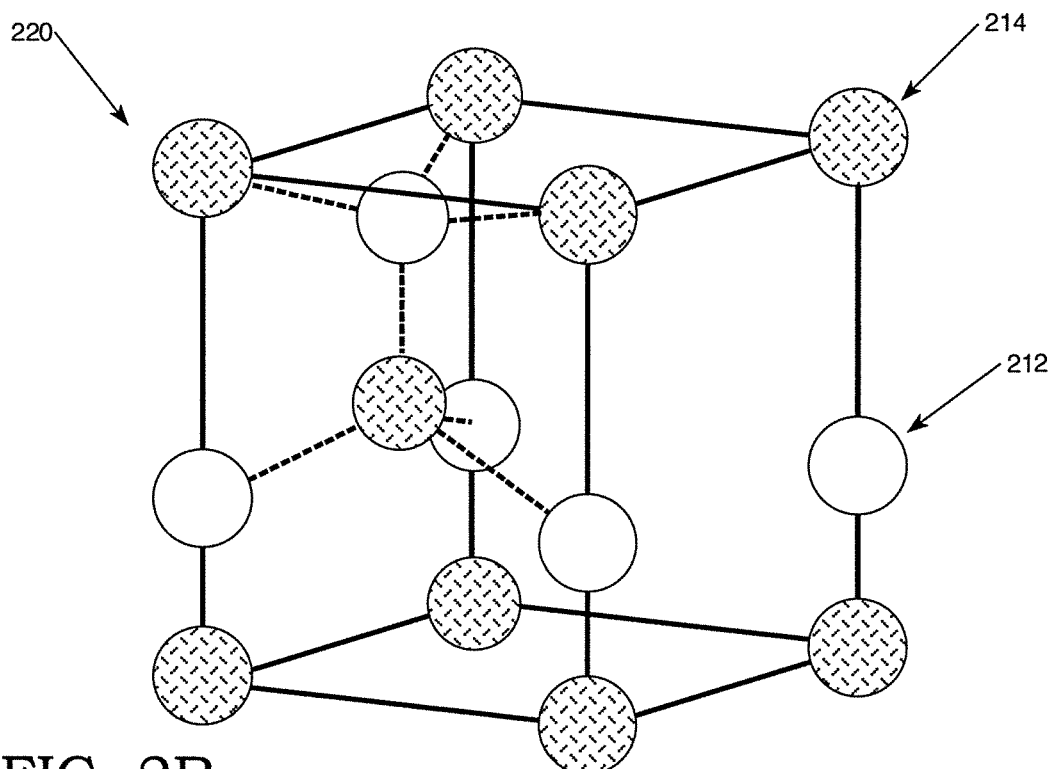
FIG. 2B depicts an illustrative hexagonal wurtzite crystal structure according to one or more aspects shown and described herein.

In some aspects, a coating is based on an aluminum nitride structure whereby the aluminum in the MN matrix may be partially replaced randomly by a desired amount of the metal, where amount is dependent on the process conditions and the initial concentration of precursors, which results in cubic metal aluminum nitride 210 (as shown in FIG. 2A) or hexagonal wurtzite metal aluminum nitride 220 (as shown in FIG. 2B). The relative amount of aluminum (e.g. x in the above formulae) can optionally be altered between 0.78 to 0.92 or greater whereby the resulting crystal structure can vary from hexagonal wurtzite (higher aluminum amount) to cubic (lower aluminum amount). The variation in the crystal lattice makes it possible to influence properties of the resulting coating such as hardness, coefficient of friction, surface morphology such as roughness, or other that will determine the end performance characteristics of the resulting coated surface. In some aspects, a structure of the material is or includes a cubic crystal form. In some aspects, a structure is or includes a hexagonal wurtzite crystal form. In some aspects, one or more coatings or regions (optionally layers) within coatings are mixes of cubic crystal forms and hexagonal wurtzite crystal forms. Optionally, an intermediate thickness has a lower relative amount of hexagonal wurtzite crystal form than an outer surface of the coating thickness such that the amount of material with a hexagonal wurtzite crystal form is higher on the surface of the coating than at one or more intermediate thicknesses. By increasing the amount of hexagonal wurtzite crystal form an outer surface may be produced with lower hardness relative to an intermediate thickness that has a relatively lower amount of hexagonal wurtzite crystal form.

In FIG. 2A, the cubic metal aluminum nitride 210 may be a unit that includes metal atoms 214 and aluminum atoms 212 arranged as substantially as shown. In FIG. 2B, the hexagonal wurtzite metal aluminum nitride 220 may be a unit that includes the metal atoms 214 associated with the aluminum atoms 212 in a distinct hexagonal wurtzite arrangement. Formation of the $Me_{1-x}Al_xN$ or $Me_{1-x}Al_xCN$ in either arrangement will be described in greater detail hereinbelow.

Figure 3:
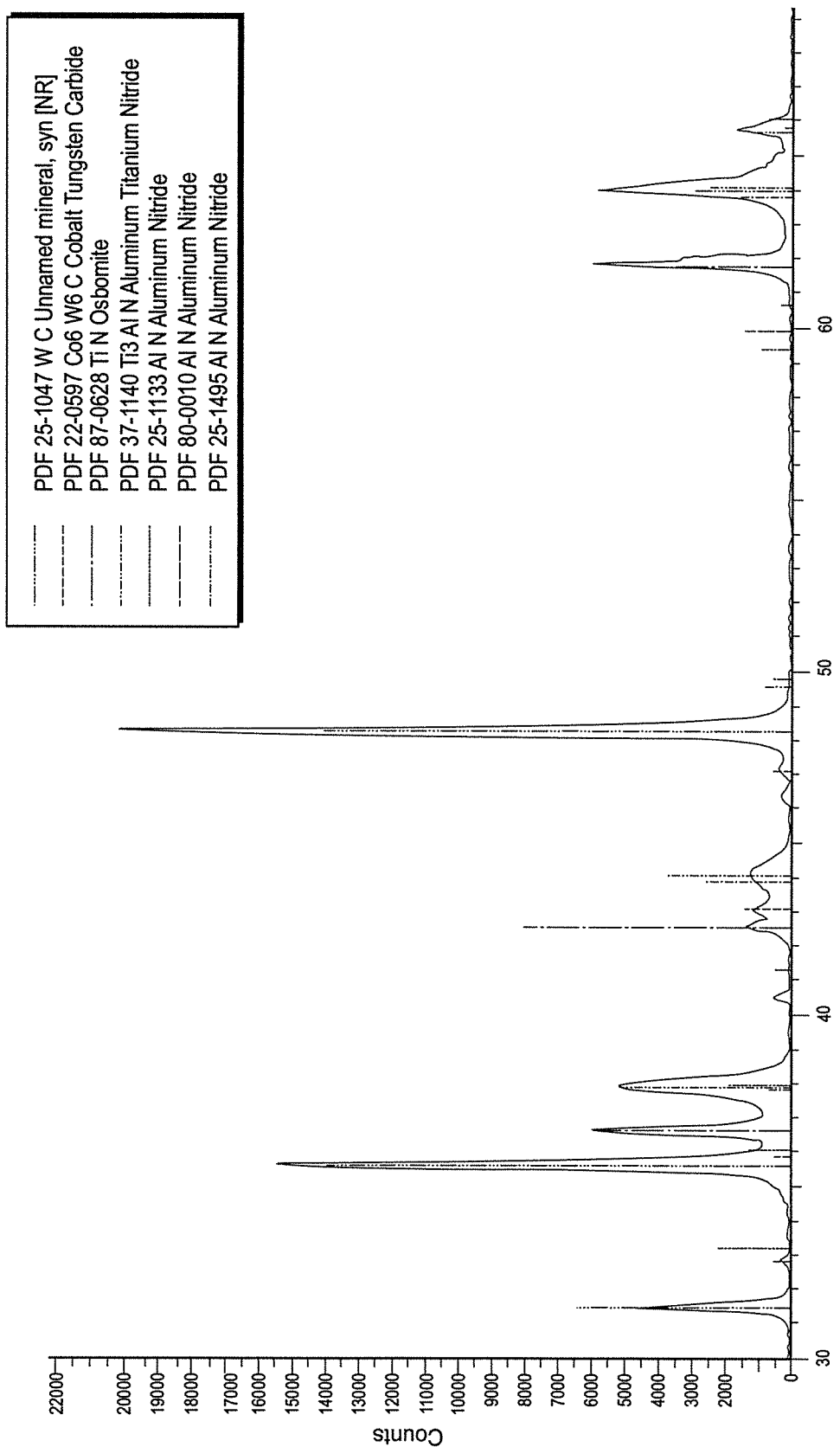
FIG. 3 graphically depicts an illustrative cubic titanium aluminum nitride (TiAlN) X-ray diffraction (XRD) spectrum according to one or more aspects shown and described herein.
Figure 4:
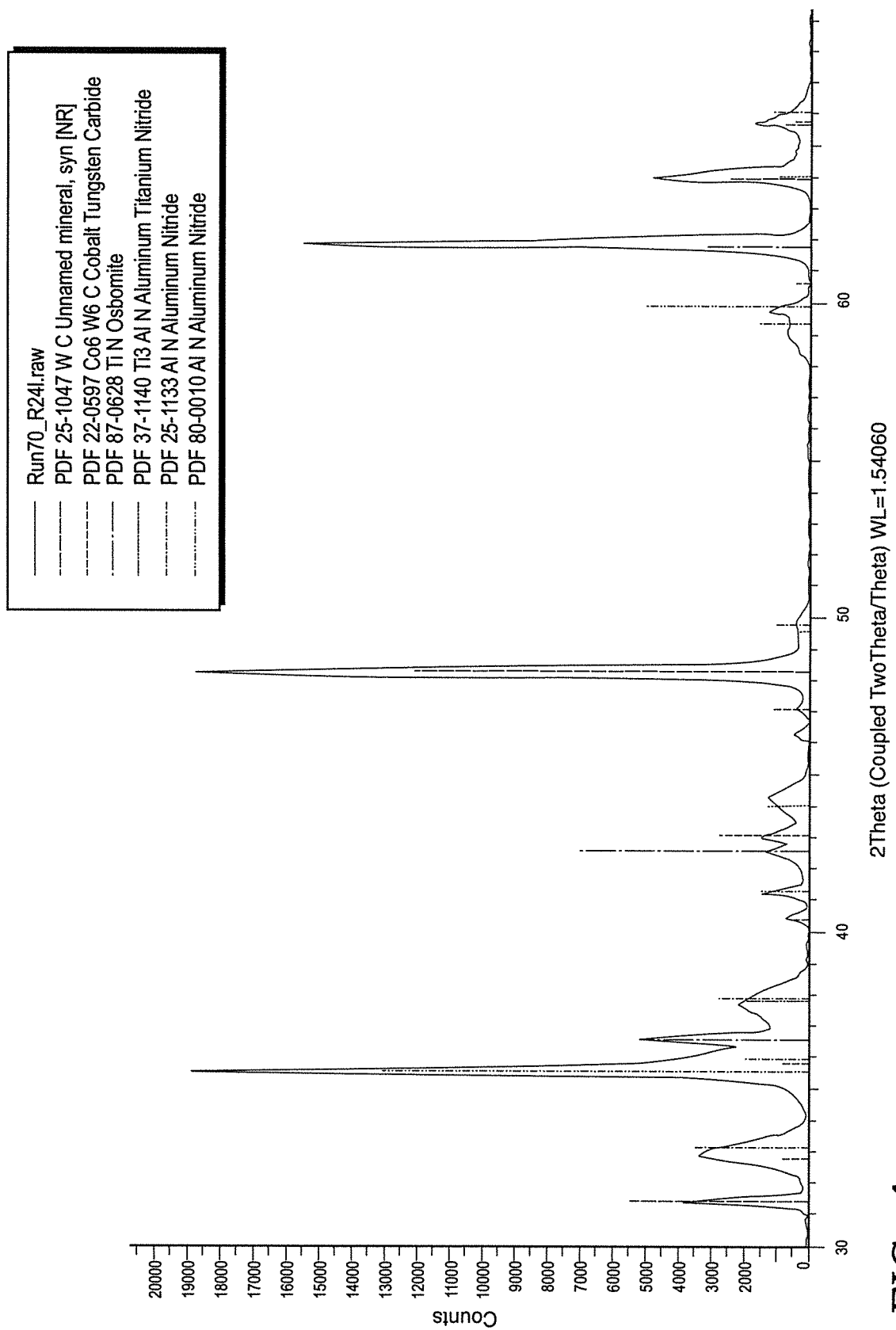
FIG. 4 graphically depicts an illustrative mixed (cubic and hexagonal) TiAlN XRD spectrum according to one or more aspects shown and described herein.

In various aspects, the cubic metal aluminum nitride 210 can generally be distinguished from the hexagonal wurtzite metal aluminum nitride 220 via X-ray diffraction (XRD). For example, various peaks shown in an XRD plot may be indicative of whether the $Me_{1-x}Al_xN$ or $Me_{1-x}Al_xCN$ is formed as cubic crystal form 210 or hexagonal wurtzite crystal form 220. For example, as shown in FIG. 3, a TiAlN coating material is examined revealing a cubic structure. In contrast, as shown in FIG. 4 a similarly TiAlN material is illustrated but formed with a mixed cubic and hexagonal structure.

Figure 5A:
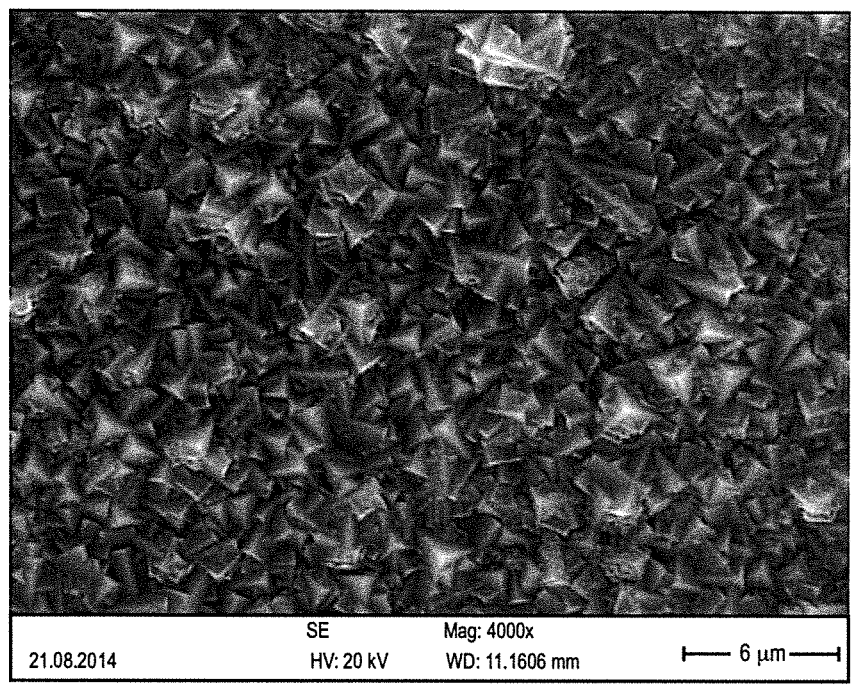
FIG. 5A depicts a detailed view of a scanning electron micrograph image of cubic TiAlN according to one or more aspects shown and described herein.
Figure 5B:
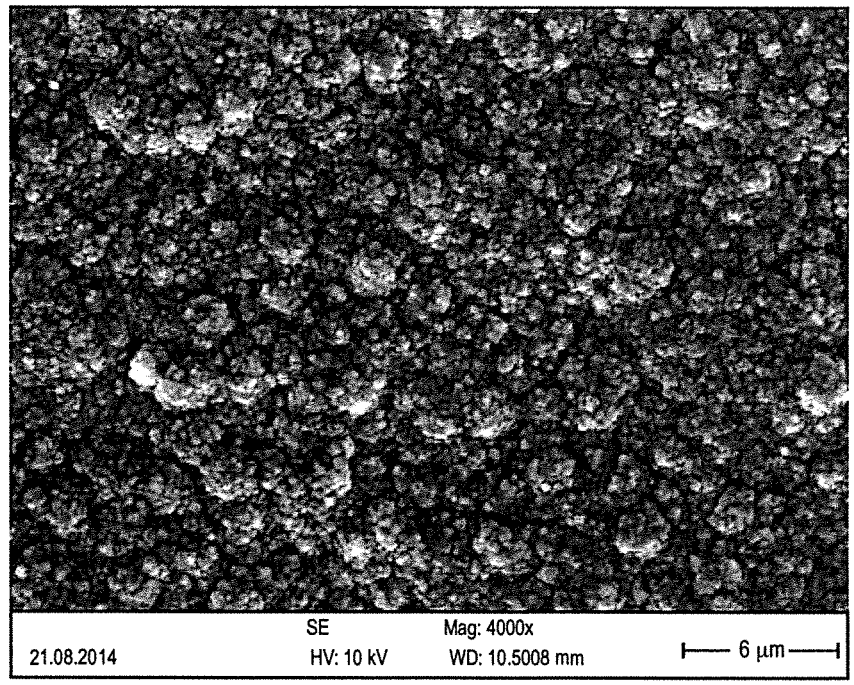
FIG. 5B depicts a detailed view of a scanning electron micrograph image of mixed (cubic and hexagonal) TiAlN according to one or more aspects shown and described herein.

FIG. 5A illustrates a SEM image of a cubic structured TiAlN coating illustrating the unique surface structure of this material. In contrast, the microstructure of a mixed cubic/hexagonal TiAlN material as shown in FIG. 5B, reveals a more rounded appearance resulting in a material with reduced hardness and reduced surface roughness.

As previously described herein, the metal in the metal aluminum nitride or carbonitride may be any metal, optionally any transition metal, or combination of transition metals. In some aspects, the metal may be or include titanium (Ti). As such, the compound that is deposited on the surface of the extrusion tool may be titanium aluminum nitride (TiAlN) or titanium aluminum carbonitride (TiAlCN). An exemplary TiAlN material as depicted in FIG. 5A was examined by EDX and the resulting spectrum depicted in FIG. 6. The data demonstrate a material with an elemental metal and aluminum composition of the overall composition of $Ti_{16.03}Al_{83.97}$. The surface coated with the exemplary TiAlN material is illustrated in FIG. 7 showing a relatively uniform coating on the surface of the material whereby coating thickness is approximately 4 μm.

Figure 8:
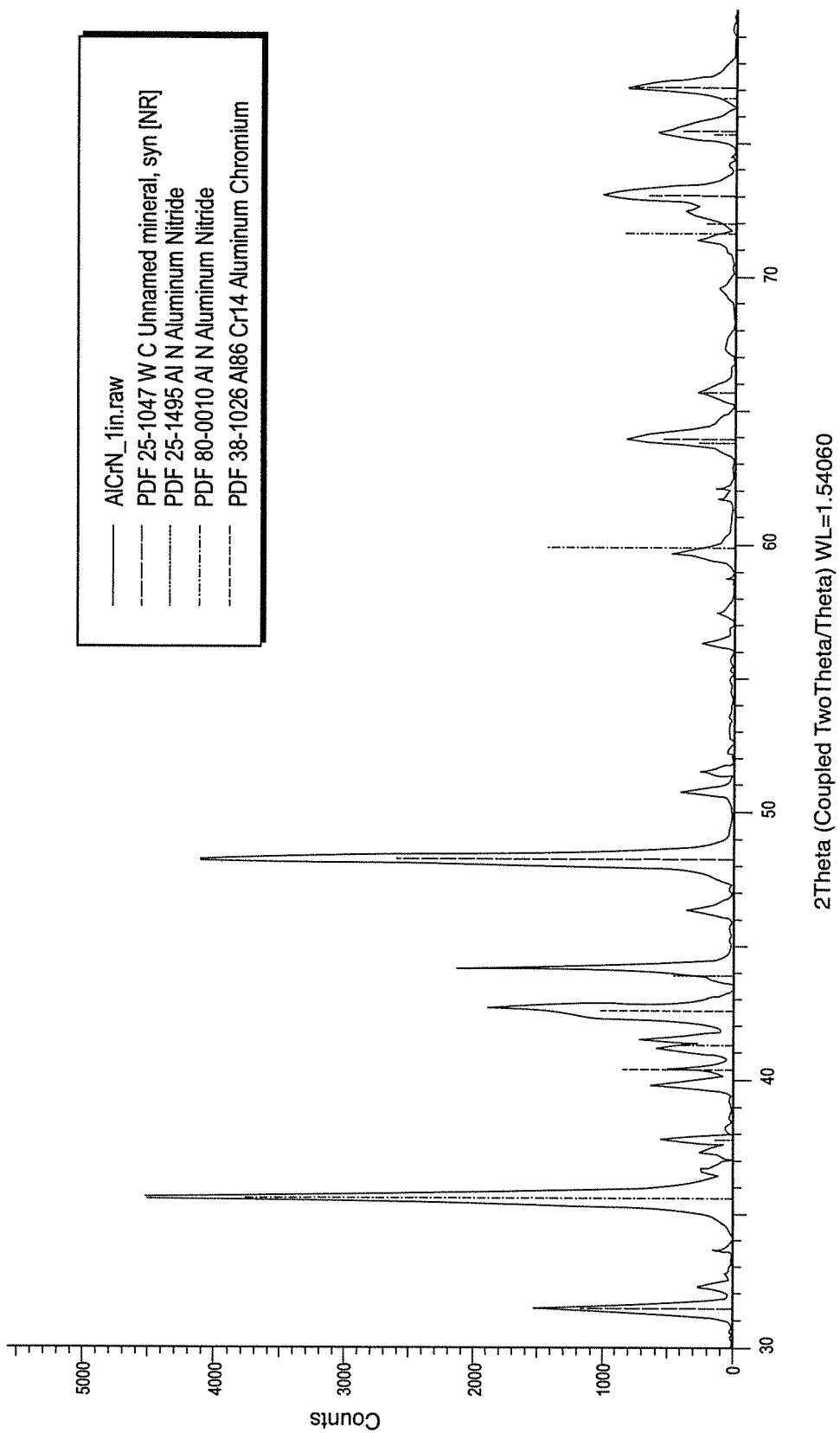
FIG. 8 graphically depicts an illustrative chromium aluminum nitride (CrAlN) XRD spectrum according to one or more aspects shown and described herein.
Figure 9:
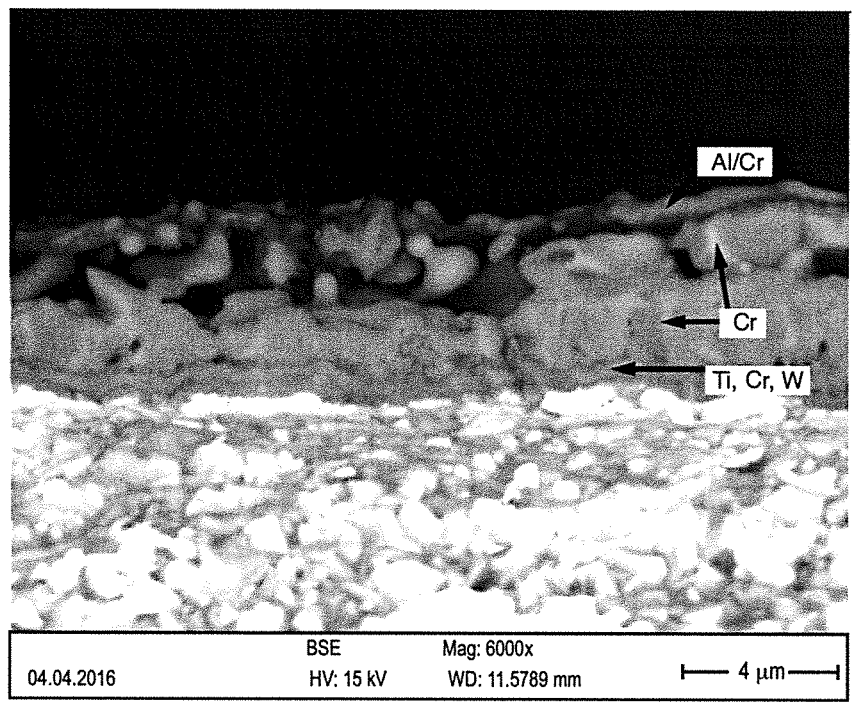
FIG. 9 depicts a detailed view of a cross-sectional image of a TiN/CrAlN system according to one or more aspects shown and described herein.

In other aspects, the metal may be or include chromium (Cr). As such, the compound that is deposited on the surface of the extrusion tool may be chromium aluminum nitride (CrAlN) or chromium aluminum carbonitride (CrAlCN). An exemplary CrAlN material was coated onto a surface and studied by methods similar to the above TiAlN material. Analyses by XRD (FIG. 8) reveals a cubic structure.

In some aspects, a surface coating of relatively softer or lower wear resistance material may be layered on the surface of a coating. A surface coating is optionally one of materials illustratively selected from the group of, but not limited to, $BN$, $MoS_2$, $WS_2$ or other similar self-lubrication coatings. The addition of the surface coating is optionally in addition to a metal aluminum nitride or carbonitride coating as described herein or the surface characteristics are imparted by the relative amounts of Al in the coating materials so that similar lubricating layers may be added to the material surface.

Figure 10:
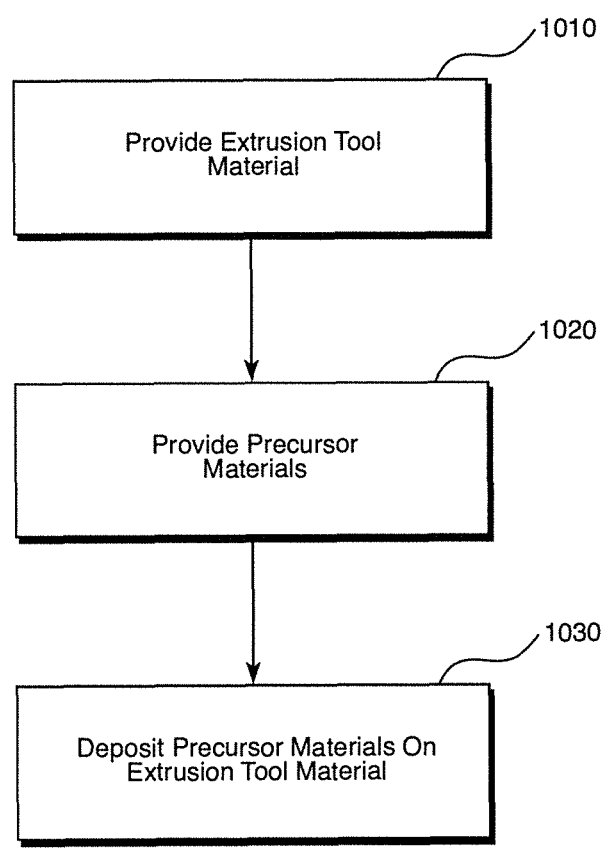
FIG. 10 depicts a flow diagram of an illustrative method of forming a coated body according to one or more aspects shown and described herein.

In various aspects, the metal aluminum nitride or carbonitride may be formed by vapor deposition methods. Such a formation may be accomplished via chemical vapor deposition (CVD), physical vapor deposition (PVD), or other. Preferably, a coating is accomplished by chemical vapor deposition as such a process is not limited by line of sight issues and will result in an improved coating relative to PVD methods, particularly on the surface or surfaces of a guide channel. Chemical vapor deposition generally includes exposing the extrusion tool to one or more precursor materials, which react and/or decompose on the surface of the extrusion tool to produce the one or more coatings thereon. As used herein, "chemical vapor deposition" also includes variants thereof such as, for example, low-temperature chemical vapor deposition (LT-CVD), moderate temperature chemical vapor deposition (MT-CVD), and high-temperature chemical vapor deposition (HT-CVD). FIG. 10 depicts an illustrative process for forming the one or more coatings on a surface of the extrusion tool (e.g., forming a coated body) via chemical vapor deposition according to one or more aspects.

At step 1010, the extrusion tool with one or more surfaces to be coated may be provided. The extrusion tool generally refers to a previously formed extrusion tool that is fully assembled and can be used for object formation and/or components of an extrusion tool that still require one or more further assembly/formation processes. For example, the extrusion tool may be an amount of material that must be formed (e.g., by cutting, bonding, binding together, and/or the like) before the extrusion tool can be used. That is, the extrusion tool surface may be provided for the purposes of depositing the one or more coatings thereon, and then subsequently undergoing a final formation step to completely assemble the extrusion tool. In another example, the extrusion tool may be fully assembled prior to being presented for depositing of the one or more coatings thereon.

At step 1020, the precursor materials may be provided. Illustrative precursor materials may include, but are not limited to, hydrogen ($H_2$), nitrogen ($N_2$), an aluminum halide compound, a metal halide compound, ammonia ($NH_3$), and a hydrocarbon. Particular examples of metal halides may include, but are not limited to titanium(IV) chloride ($TiCl_4$). Illustrative examples of a hydrocarbon may include, but are not limited to methane, ethane, ethene, and ethyne.

In various aspects, the precursor materials that are provided in accordance with step 1020 may be provided separately of one another. That is, each precursor material may be contained in a chamber or the like that is separate from other chambers or the like that contain other precursor materials. Each chamber or the like may be separately controllable such that when a precursor material contained within the chamber is expelled, the flow rate thereof can be adjusted. As such, the precursor materials may each be exposed to the extrusion tool material independently of one another and at a flow rate that is different from the flow rates of other precursor materials.

At step 1030, the precursor materials may be deposited on the extrusion tool material. That is, the chambers or the like containing the various precursor materials may be independently controlled to expel a particular amount of precursor material therefrom such that the various precursor materials impinge the one or more surfaces of the extrusion tool material, optionally react, and form the one or more coatings.

In various aspects, the precursor materials may be deposited on the extrusion tool material in a controlled environment. That is, the environment containing the extrusion tool material to be exposed to the precursor materials may be controlled by adjusting the temperature of the environment, adjusting the pressure of the environment, and/or adjusting other environmental variables. For example, the environment may be adjusted such that a temperature of an area surrounding the extrusion tool material ranging from about 650° C. to about 1050° C., including about 650° C., about 700° C., about 750° C., about 800° C., about 850° C., about 900° C., about 950° C., about 1000° C., about 1050° C., or any value or range between any two of these values (including endpoints). In a particular aspect, the temperature of the area surrounding the extrusion tool material may be about 700° C. to about 750° C., optionally about 750° C. In another particular aspect, the temperature of the area surrounding the extrusion tool material may be about 780° C. In another particular aspect, the temperature of the area surrounding the extrusion tool material may be about 800° C. In another particular aspect, the temperature of the area surrounding the extrusion tool material may be about 850° C. In another particular aspect, the temperature of the area surrounding the extrusion tool material may be about 1020° C.

In some aspects of a coating process the environment may be adjusted such that a pressure of an area surrounding the extrusion tool material is about 1 millibar (mbar) to about 60 mbar, including about 1 mbar, about 10 mbar, about 20 mbar, about 30 mbar, about 40 mbar, about 50 mbar, about 60 mbar, or any value or range between any two of these values (including endpoints). In a particular aspect, the pressure of the area surrounding the extrusion tool material may be about 5 mbar. In another particular aspect, the pressure of the area surrounding the extrusion tool material may be about 8 mbar. In another particular aspect, the pressure of the area surrounding the extrusion tool material may be about 10 mbar. In another particular aspect, the pressure of the area surrounding the extrusion tool material may be about 20 mbar. In another particular aspect, the pressure of the area surrounding the extrusion tool material may be about 60 mbar. Environmental conditions (including temperature, pressure, and/or the like) that are suitable for particular precursor materials, combinations thereof, and/or extrusion tool materials may generally be understood.

In various aspects, the precursor materials may be deposited on the extrusion tool material for a period of time. The period of time is not limited by this disclosure, and may be any period of time that is suitable for ensuring a sufficient amount of precursor materials are deposited, ensuring that the precursor materials react to form the one or more coatings on the extrusion tool materials, and/or the like. Illustrative periods of time include, but are not limited to, about 20 minutes or greater, optionally 30 minutes or greater. In some aspects, a period of time is from about 20 minutes to about 360 minutes, including about 30 minutes, about 60 minutes, about 90 minutes, about 120 minutes, about 150 minutes, about 180 minutes, about 210 minutes, about 240 minutes, about 270 minutes, about 300 minutes, about 330 minutes, about 360 minutes, or any value or range between any two of these values (including endpoints). In a particular aspect, the time period may be about 60 minutes. In another particular aspect, the time period may be about 90 minutes. In another particular aspect, the time period may be about 100 minutes. In another particular aspect, the time period may be about 180 minutes. Other time periods that are suitable for particular precursor materials, combinations thereof, and/or extrusion tool materials may generally be understood.

In various aspects, each one of the precursor materials may be deposited on the extrusion tool material at a flow rate. The flow rate is not limited by this disclosure, and may be any rate that is suitable for ensuring a sufficient amount of precursor materials are deposited, thereby ensuring that the precursor materials react to form the one or more coatings on the extrusion tool materials, and/or the like.

Illustrative flow rates for liquid or gas precursor materials may range from about 0.1 liters per minute (L/min) to about 250 L/min, including about 0.1 L/min, about 0.5 L/min, about 1 L/min, about 2 L/min, about 3 L/min, about 4 L/min, about 5 L/min, about 10 L/min, about 20 L/min, about 30 L/min, about 40 L/min, about 50 L/min, about 60 L/min, about 70 L/min, about 80 L/min, about 90 L/min, about 100 L/min, about 150 L/min, about 200 L/min, about 250 L/min, or any value or range between any two of these values (including endpoints). In a particular aspect, the flow rate for liquid or gas precursor material may be about 0.1 L/min. In another particular aspect, the flow rate for liquid or gas precursor material may be about 0.2 L/min. In another particular aspect, the flow rate for liquid or gas precursor material may be about 0.5 L/min. In another particular aspect, the flow rate for liquid or gas precursor material may be about 0.7 L/min. In another particular aspect, the flow rate for liquid or gas precursor material may be about 0.85 L/min. In another particular aspect, the flow rate for liquid or gas precursor material may be about 1.0 L/min. In another particular aspect, the flow rate for liquid or gas precursor material may be about 1.1 L/min. In another particular aspect, the flow rate for liquid or gas precursor material may be about 1.2 L/min. In another particular aspect, the flow rate for liquid or gas precursor material may be about 2.0 L/min. In another particular aspect, the flow rate for liquid or gas precursor material may be about 5.0 L/min. In another particular aspect, the flow rate for liquid or gas precursor material may be about 6.0 L/min. In another particular aspect, the flow rate for liquid or gas precursor material may be about 20 L/min. In another particular aspect, the flow rate for liquid or gas precursor material may be about 45 L/min. In another particular aspect, the flow rate for liquid or gas precursor material may be about 46 L/min. In another particular aspect, the flow rate for liquid or gas precursor material may be about 55 L/min. In aspects where a precursor is hydrogen ($H_2$), the flow rate may range from, for example, about 10 L/min to about 250 L/min, including about 10 L/min, about 25 L/min, about 50 L/min, about 75 L/min, about 100 L/min, about 125 L/min, about 150 L/min, about 175 L/min, about 200 L/min, about 225 L/min, about 250 L/min, or any value or range between any two of these values (including endpoints). In aspects where a precursor is nitrogen ($N_2$), the flow rate may range from, for example, about 10 L/min to about 30 L/min, including about 0 L/min, about 5 L/min, about 10 L/min, about 15 L/min, about 20 L/min, about 25 L/min, about 30 L/min, or any value or range between any two of these values (including endpoints). In aspects where a precursor is ammonia ($NH_3$), the flow rate may range from, for example, about 0.2 L/min to about 5 L/min, including about 0.2 L/min, about 0.3 L/min, about 0.4 L/min, about 0.5 L/min, about 0.6 L/min, about 0.7 L/min, about 0.8 L/min, about 0.9 L/min, about 1.0 L/min, about 2.0 L/min, about 3.0 L/min, about 4.0 L/min, about 5.0 L/min, or any value or range between any two of these values (including endpoints). In aspects where a precursor is aluminum(III) chloride ($AlCl_3$), the flow rate may range from, for example, about 0.1 L/min to about 7 L/min, including about 0.1 L/min, about 0.2 L/min, about 0.3 L/min, about 10 L/min, about 0.4 L/min, about 0.5 L/min, about 0.6 L/min, about 0.7 L/min, about 0.8 L/min, about 0.9 L/min, about 1.0 L/min, about 2.0 L/min, about 3.0 L/min, about 4.0 L/min, about 5.0 L/min, about 6.0 L/min, about 7.0 L/min, or any value or range between any two of these values (including endpoints). In aspects where a precursor is chromium(III) chloride ($CrCl_3$), the flow rate may range from, for example, about 0.1 L/min to about 7 L/min, including about 0.1 L/min, about 0.2 L/min, about 0.3 L/min, about 10 L/min, about 0.4 L/min, about 0.5 L/min, about 0.6 L/min, about 0.7 L/min, about 0.8 L/min, about 0.9 L/min, about 1.0 L/min, about 2.0 L/min, about 3.0 L/min, about 4.0 L/min, about 5.0 L/min, about 6.0 L/min, about 7.0 L/min, or any value or range between any two of these values (including endpoints). Other flow rates that are suitable for particular precursor materials, combinations thereof, and/or extrusion tool materials may generally be understood.

Illustrative flow rates for precursor materials may range from about 50 grams per hour (g/h) to about 100 g/h, including about 50 g/h, about 60 g/h, about 70 g/h, about 80 g/h, about 90 g/h, about 100 g/h, or any value or range between any two of these values (including endpoints). In a particular aspect, the flow rate for a solid precursor material may be about 50 g/h. In another particular aspect, the flow rate for a solid precursor material may be about 52 g/h. In another particular aspect, the flow rate for a solid precursor material may be about 60 g/h. In another particular aspect, the flow rate for a solid precursor material may be about 90 g/h. In aspects where a precursor is titanium(IV) chloride ($TiCl_4$), the flow rate may range from, for example, about 10 g/h to about 500 g/h, including about 10 g/h, about 20 g/h, about 30 g/h, about 40 g/h, about 50 g/h, about 60 g/h, about 70 g/h, about 80 g/h, about 90 g/h, about 100 g/h, about 200 g/h, about 300 g/h, about 400 g/h, about 500 g/h, or any value or range between any two of these values (including endpoints). Other flow rates that are suitable for particular precursor materials, combinations thereof, and/or extrusion tool materials may generally be understood.

EXAMPLES

Tables 1-5 below provide illustrative examples of various environmental conditions, time periods, and flow rates that may be used for depositing precursor materials on the extrusion tool according to various aspects:

TABLE 1

| TiAlN | |
|---|---|
| | TiAlN |
| Temperature (° C.) | 850 |
| Coating time (min) | 90 |
| Process pressure (mbar) | 20 |
| Mass Flow Rates (slm) | |
| $H_2$ (L/min) | 55 |
| $N_2$ (L/min) | 6 |
| $AlCl_3$ (L/min) | 0.2 |
| $TiCl_4$ (g/h) | 60 |
| $NH_3$ (L/min) | 1.1 |

TABLE 2

| TiAlN | |
|---|---|
| | TiAlN |
| Temperature (° C.) | 800 |
| Coating time (min) | 60 |
| Process pressure (mbar) | 10 |
| Mass Flow Rates (slm) | |
| $H_2$ (L/min) | 46 |
| $N_2$ (L/min) | 2 |
| $AlCl_3$ (L/min) | 0.5 |
| $TiCl_4$ (g/h) | 50 |
| $NH_3$ (L/min) | 0.85 |

TABLE 3

| TiAlN | |
|---|---|
| | TiAlN |
| Temperature (° C.) | 780 |
| Coating time (min) | 100 |
| Process pressure (mbar) | 8 |
| Mass Flow Rates (slm) | |
| $H_2$ (L/min) | 20 |
| $N_2$ (L/min) | 6 |
| $AlCl_3$ (L/min) | 1 |
| $TiCl_4$ (g/h) | 52 |
| $NH_3$ (L/min) | 1.1 |

TABLE 4

| TiAlN | |
|---|---|
| | TiAlN |
| Temperature (° C.) | 750 |
| Coating time (min) | 100 |
| Process pressure (mbar) | 5 |
| Mass Flow Rates (slm) | |
| $H_2$ (L/min) | 55 |
| $N_2$ (L/min) | 6 |
| $AlCl_3$ (L/min) | 0.2 |
| $TiCl_4$ (g/h) | 95 |
| $NH_3$ (L/min) | 0.85 |

TABLE 5

| CrAlN | |
|---|---|
| | CrAlN |
| Temperature (° C.) | 1020 |
| Coating time (min) | 180 |
| Process pressure (mbar) | 60 |
| Mass Flow Rates (slm) | |
| $H_2$ (L/min) | 45 |
| $N_2$ (L/min) | 5 |
| $AlCl_3$ (L/min) | 0.7 |
| $CrCl_3$ (L/min) | 0.1 |
| $NH_3$ (L/min) | 1.2 |

Figure 6:
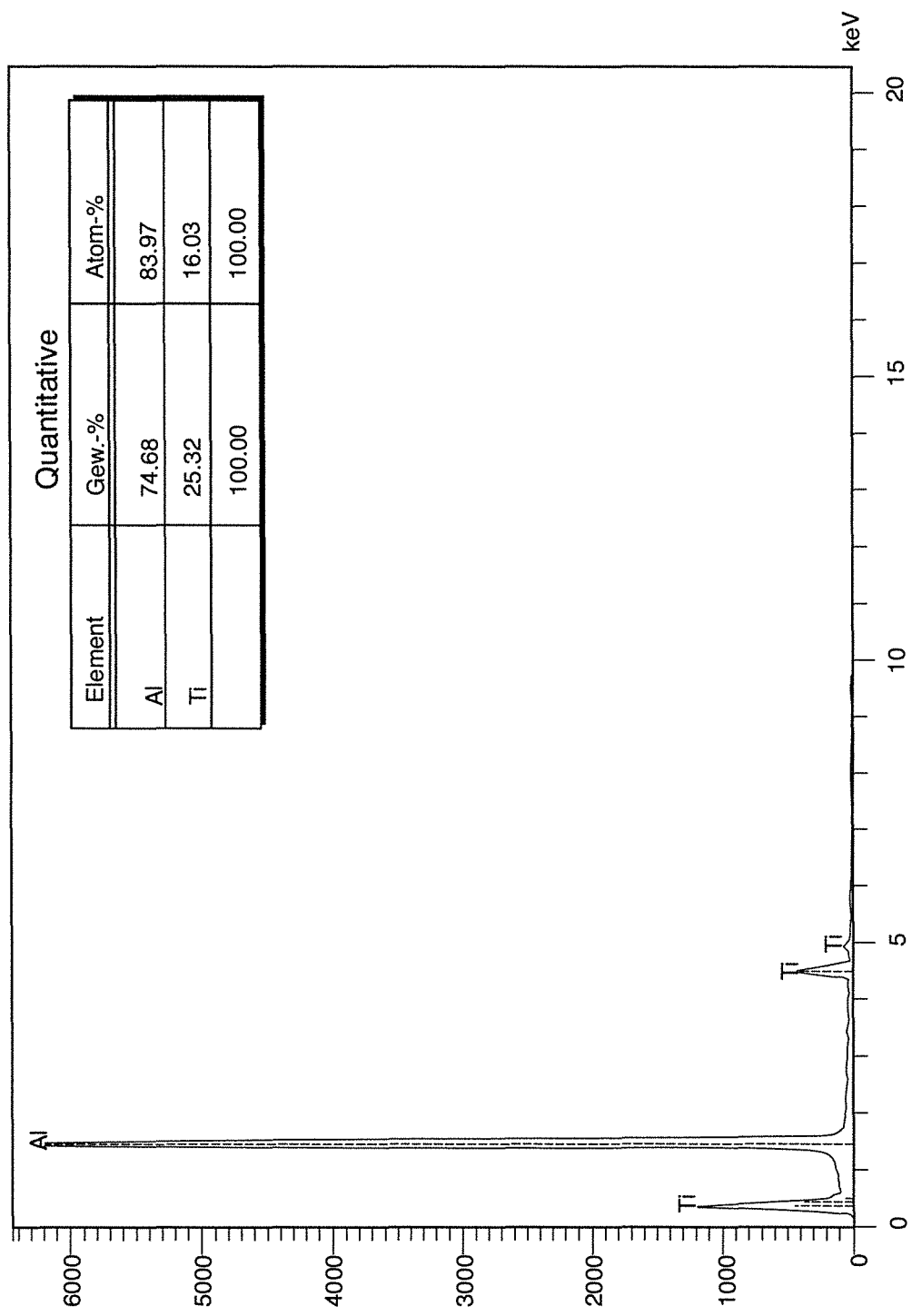
FIG. 6 graphically depicts an illustrative energy-dispersive X-ray (EDX) spectrum of cubic TiAlN according to one or more aspects shown and described herein.
Figure 7:
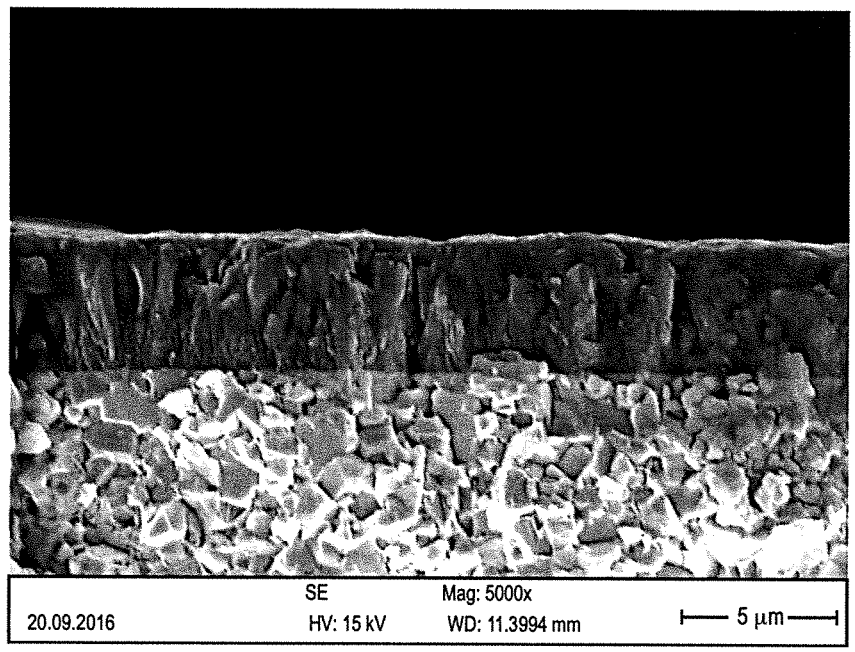
FIG. 7 depicts a detailed view of a cross-sectional image of a titanium nitride (TiN)/cubic TiAlN system according to one or more aspects shown and described herein.

FIG. 6 shows an EDX spectrum of a cubic TiAlN coating that was deposited using the conditions from example 3. The coating system comprises two layers: a first layer (TiN) with a thickness ~1.5 μm and a second layer (TiAlN) with a thickness ~4.5 μm. The coating microhardness was 3250±250 HV0.025 (31.8±2.4 GPa), and the average roughness was 0.2 µm (Ra). The outer surface of this coating is also represented in FIG. 5A.

As a result of the deposition of the precursor materials on the extrusion tool material, the extrusion tool exhibits the various properties as described herein and may be used for extrusion.

It should now be understood that the extrusion tools described herein are coated with one or more metal aluminum nitride and/or metal aluminum carbonitride coatings. Such coatings on the extrusion tools result in coated extrusion tools that exhibit increased performance and a longer service life relative to other extrusion tools. The coated extrusion tools further exhibit lower roughness properties and a softer, less wear resistant surface relative to other extrusion tools. In addition, the coated extrusion tools exhibit higher geometrical accuracy relative to other extrusion tools.

It will be apparent to those skilled in the art that various modifications and variations can be made to the aspects described herein without departing from the spirit and scope of the claimed subject matter. Thus, it is intended that the specification cover the modifications and variations of the various aspects described herein, provided such modification and variations come within the scope of the appended claims and their equivalents.

The invention claimed is:

1. An extrusion tool comprising:
   a surface that defines a guide channel, the guide channel having a length;
   the surface contacting a coating disposed thereon, the coating comprising at least one layer comprising $Me_{1-x}Al_xN$ and/or $Me_{1-x}Al_xCN$ wherein Me is a metal, x is an atomic ratio of aluminum relative to a total amount of metal and aluminum; and
   the layer having a thickness whereby x varies through the thickness, and whereby a value of x at an outer surface of the layer is higher than the value of x at an intermediate thickness, wherein the layer comprises a cubic phase structure at the intermediate thickness, and a mixed phase structure of both cubic and a hexagonal wurtzite crystal forms at the outer surface.

2. The tool of claim 1 whereby x at the intermediate thickness is from 0.78 to 0.88.

3. The tool of claim 1 whereby x at the outer surface of the layer thickness is from 0.85 to 0.92.

4. The tool of claim 1 wherein the coating comprises a metal aluminum carbonitride composition having a formula $Me_{1-x}Al_xC_yN_{1-y}$, wherein y is from 0.01 to 0.08.

5. The tool of claim 1, wherein the metal is titanium, chromium, zirconium, hafnium, or vanadium.

6. The tool of claim 1, wherein a microhardness of an outer region is lower than a microhardness of an intermediate region of the coating.

7. The tool of claim 1, wherein the outer surface of the layer has a microhardness of 2300 $HV_{0.025}$ to 2900 $HV_{0.025}$.

8. The tool of claim 1, wherein an intermediate region of the layer has a microhardness of 3000 $HV_{0.025}$ to 3600 $HV_{0.025}$.

9. The tool of claim 1 wherein a crystal structure of the layer composition varies through the thickness; and
   the outer surface of the layer comprising a mixed phase structure of both cubic and hexagonal wurtzite crystal forms.

10. The tool of claim 1 wherein a crystal structure of the layer composition varies through the thickness; and
    the intermediate thickness of the layer comprises a cubic crystal form.

* * * * *